United States Patent
Ko et al.

(10) Patent No.: US 7,564,077 B2
(45) Date of Patent: Jul. 21, 2009

(54) PERFORMANCE AND AREA SCALABLE CELL ARCHITECTURE TECHNOLOGY

(75) Inventors: Uming Ko, Plano, TX (US); Dharin Shah, Bangalore (IN); Senthil Sundaramoorthy, Bangalore (IN); Girishankar Gurumurthy, Chennai (IN); Sumanth Gururajarao, Dallas, TX (US); Rolf Lagerquist, Richardson, TX (US); Clive Bittlestone, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/745,250

(22) Filed: May 7, 2007

(65) Prior Publication Data

US 2007/0290270 A1 Dec. 20, 2007

Related U.S. Application Data

(60) Provisional application No. 60/746,579, filed on May 5, 2006.

(51) Int. Cl.
*H01L 27/10* (2006.01)
*H01L 29/73* (2006.01)
(52) U.S. Cl. ............... 257/206; 257/204; 257/E27.108
(58) Field of Classification Search ............... 257/206, 257/205, E27.108
See application file for complete search history.

(56) References Cited

U.S. PATENT DOCUMENTS

| | | | |
|---|---|---|---|
| 6,791,200 B2 * | 9/2004 | Nii | 257/206 |
| 6,995,436 B2 * | 2/2006 | Kawasaki | 257/390 |
| 2005/0001271 A1 * | 1/2005 | Kobayashi | 257/368 |

* cited by examiner

*Primary Examiner*—Ngan Ngo
(74) *Attorney, Agent, or Firm*—Ronald O. Neerings; Wade James Brady, III; Frederick J. Telecky, Jr.

(57) ABSTRACT

An integrated circuit. The integrated circuit comprises an area having a layout aligned in rows. Each row is definable by a pair of row boundaries. The integrated circuit also comprises a plurality of cells, comprising a first set of cells. Each cell in the first set of cells spans at least two rows and comprises a PMOS transistor having a source/drain region that spans across one of the row boundaries and an NMOS transistor having a source/drain region that spans across one of the row boundaries.

11 Claims, 6 Drawing Sheets

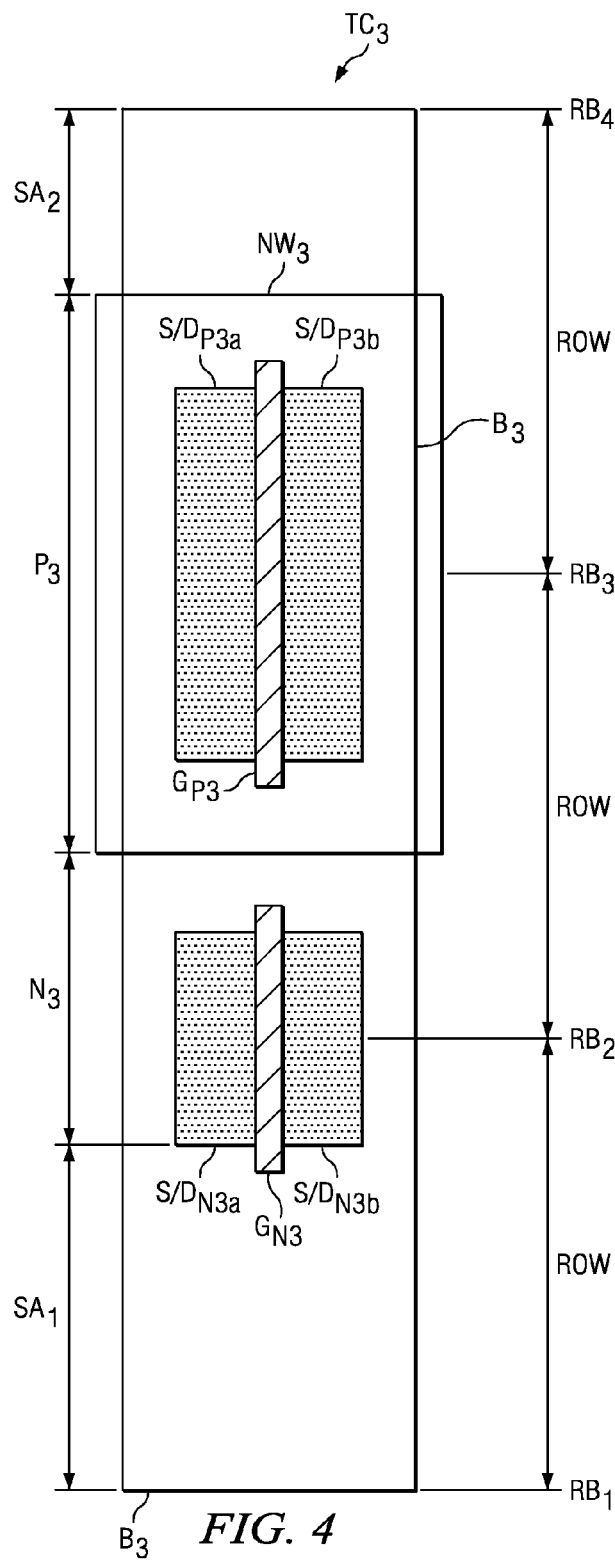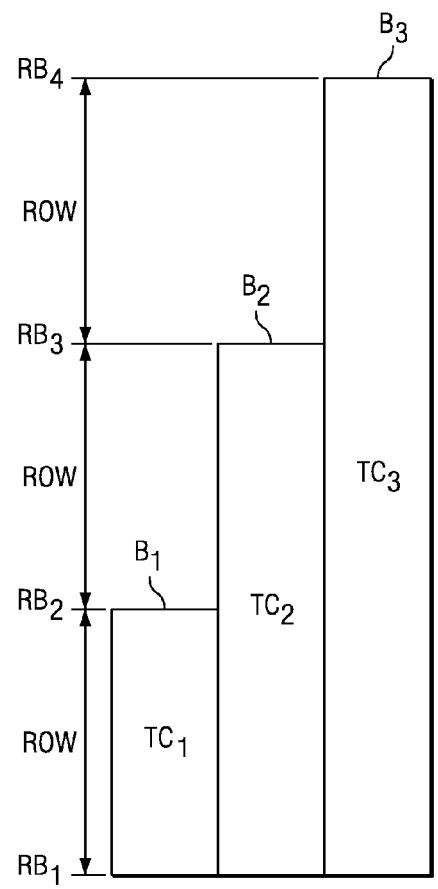
FIG. 4
FIG. 5

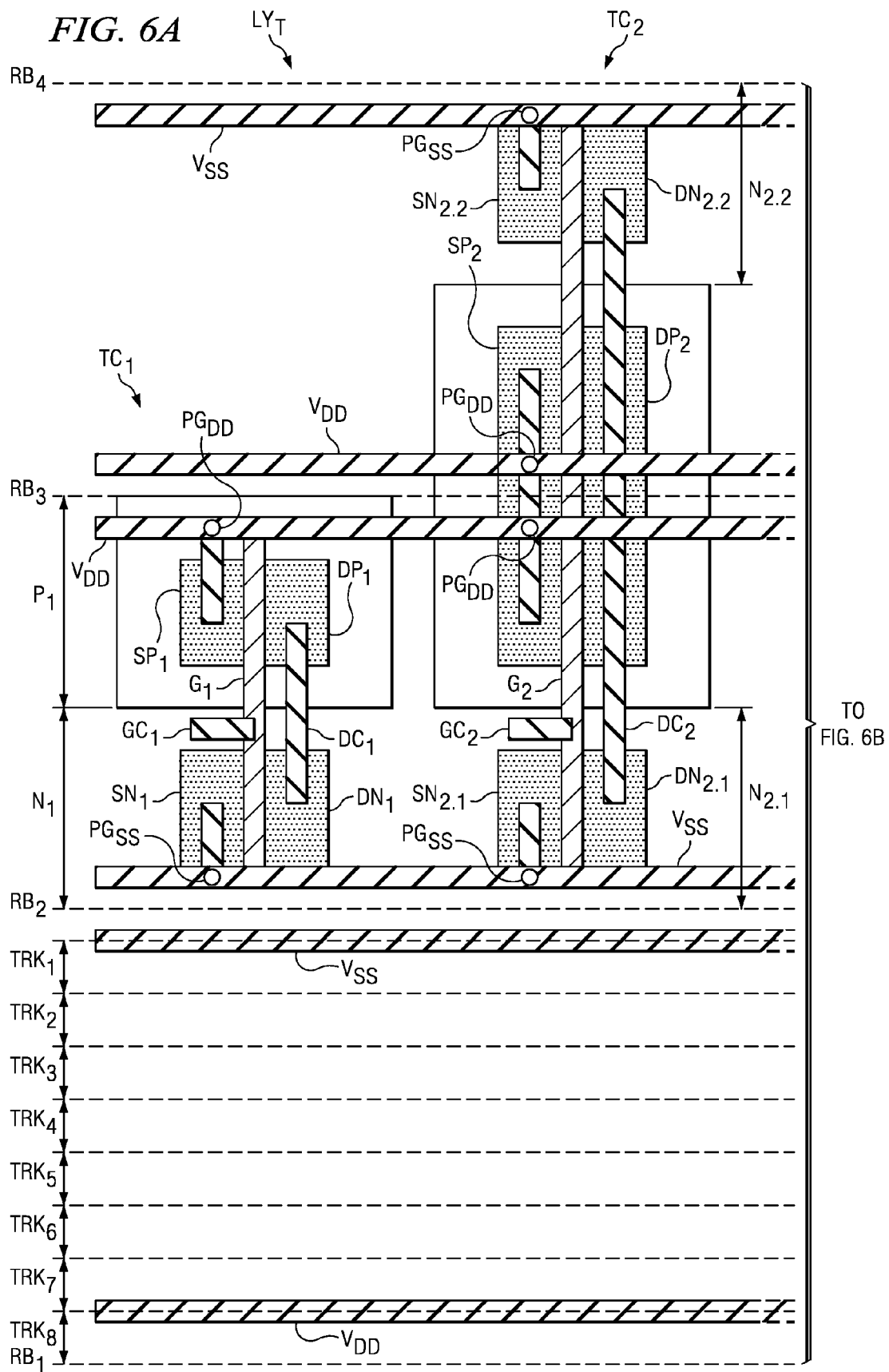

PERFORMANCE AND AREA SCALABLE CELL ARCHITECTURE TECHNOLOGY

CROSS-REFERENCES TO RELATED APPLICATIONS

This application claims priority to, the benefit of the filing date of, and hereby incorporates herein by reference, U.S. Provisional Patent Application 60/746,579, entitled "Performance & Area Scalable Cell Architecture Technology," and filed May 5, 2006.

STATEMENT REGARDING FEDERALLY SPONSORED RESEARCH OR DEVELOPMENT

Not Applicable.

BACKGROUND OF THE INVENTION

The present embodiments relate to forming integrated circuits and are more particularly directed to a performance and area scalable cell architecture technology.

The history and prevalence of integrated circuits are well known and have drastically impacted numerous electronic devices. As a result and for the foreseeable future, successful designers constantly are improving integrated circuit design, and improvements are in numerous areas including device performance and size. In general, integrated circuit design may be viewed in two steps, the first being electrical function and the second being physical layout. The latter attribute is the focus of the preferred embodiments and, thus, is further introduced below.

As further detailed later in this document, the physical layout of an integrated circuit is typically designed from layouts of smaller blocks. The smaller blocks are sometimes referred to as cells (or standard cells), and in this regard often designers establish different cells where each such cell has an associated functionality and layout. For example, the functionality may be to perform a logical function, such an inverter or other Boolean operation, including AND, NAND, OR, NOR, XOR, and XNOR, or the functionality may provide a storage function. Moreover, in some cases different cell layouts exist for the same functionality, where often the choice among those cells may be based on other either local or global circuit considerations, such as performance, speed, and power consumption. Thus, to design a portion of an integrated circuit or the entire circuit, an area is defined that will be physically located on the circuit, and cells for that area are chosen from a collection of different cells, typically referred to as a cell library (or plural, libraries). Each cell is selected from the library and located in different sub-areas within that area. In contemporary applications, these selections are performed by one or more processors operating in response to specialized software and data. In this regard, the software places the cells in locations along rows, where therefore the area or entire integrated circuit layout ultimately will include a very large number of such rows with cells aligned along each such row. Typically after the location of each cell is established, then routing is accomplished wherein interconnections are defined so as to connect various nodes of cell devices together.

In the context of cell libraries, the prior art includes various different cells. Among these cells are two different cells, shown in FIGS. 1 and 2, respectively, for implementing a pair of complementary MOS transistors, that is, where one transistor is NMOS (i.e., an n-channel MOSFET) and the other transistor is PMOS (i.e., a p-channel MOSFET). Each of these cells is described below.

Looking to FIG. 1, it illustrates a plan view of a prior art transistor cell $TC_1$, having an NMOS transistor $N_1$ and a PMOS transistor $P_1$. These two transistors form a cell that is referred to as a single row cell because the cell has a boundary $B_1$ that spans across one row when boundary $B_1$ is aligned between two successive row boundary lines $RB_1$ and $RB_2$, where row boundary lines $RB_1$ and $RB_2$ are imaginary lines used for alignment of cell $TC_1$ relative to other cells (not shown) in a physical circuit layout. NMOS transistor $N_1$ includes a first and second N-type source/drain region $S/D_{N1a}$ and $S/D_{N1b}$ that are typically co-planar and diffused within a semiconductor substrate or region that is not perceptible from the perspective of FIG. 1, where the descriptor "source/drain" is used in this document to describe generically a region that may function either as a transistor source or a transistor drain, depending on connectivity to the transistor and so that when no such connectivity is illustrated, such a region could be either a source or a drain and, hence, is referred to as a source/drain. Further, NMOS transistor $N_1$ includes a gate region $G_{N1}$ formed above and between source/drain regions $S/D_{N1a}$ and $S/D_{N1b}$ that (although the source/drain regions may, in some approaches, extend to some extent under the gate region, with various descriptions for such an approach such as extended drain or low doped drain). PMOS transistor $P_1$ includes a first and second P-type source/drain region $S/D_{P1a}$ and $S/D_{P1b}$ that are formed within an N-type well $NW_1$ (or N-well), where N-well $NW_1$ is also formed in the above-mentioned semiconductor substrate or region that is not perceptible from the perspective of FIG. 1. PMOS transistor $P_1$ also includes a gate region $G_{P1}$ formed above and between source/drain regions $S/D_{P1a}$ and $S/D_{P1b}$ (although the source/drain regions may, in some approaches, also extend to some extent under the gate region).

Looking to FIG. 2, it illustrates a plan view of a prior art transistor cell $TC_2$, having an NMOS transistor that is created in two different and non-continuous areas, which for sake of this document and reference may be referred to as half transistors in that ultimately they are connected by interconnect (not shown) so that the respective gate and source/drain regions from each half transistor are electrically connected to one another to provide a single operational NMOS transistor. For sake of reference, therefore, one NMOS half transistor $N_{2.1}$ is shown at the bottom of cell $TC_2$ and another NMOS half transistor $N_{2.2}$ is shown at the top of cell $TC_2$. Moreover, cell $TC_2$ also includes a PMOS transistor $P_2$. Thus, for cell $TC_2$, PMOS transistor $P_2$ and the entirety of the NMOS transistor that is formed by half transistors $N_{2.1}$ and $N_{2.2}$ form a cell that is referred to as a double row cell because the cell has a boundary $B_2$ that aligns on its ends along boundary row lines and spans across two adjacent rows, as defined between a row boundary line $RB_1$, across a next successive row boundary line $RB_2$, and then reaching another row boundary line $RB_3$, where again the row lines are imaginary lines used for alignment of cell $TC_2$ relative to other cells (not shown) along the same rows in a physical circuit layout. NMOS half transistor $N_{2.1}$ includes a first and second N-type source/drain region $S/D_{N2.1a}$ and $S/D_{N2.1b}$ that are typically co-planar and diffused within a semiconductor substrate or region that is not perceptible from the perspective of FIG. 2, and a gate region $G_{N2.1}$ is formed above and between source/drain regions $S/D_{N2.1a}$ and $S/D_{N2.1b}$ (where again the source/drain regions may, in some approaches, extend to some extent under the gate region). Similarly, NMOS half transistor $N_{2.2}$ includes, physically removed from NMOS half transistor $N_{2.1}$, a first and second N-type source/drain region $S/D_{N2.2a}$ and $S/D_{N2.2b}$ that are typically co-planar and diffused within the above-mentioned semiconductor substrate or region, and a gate region $G_{N2.2}$ is formed above and between source/drain regions $S/D_{N2.2a}$ and $S/D_{N2.2b}$. Note, therefore, that the overall source or drain regions of NMOS transistor $N_2$ are in effect interrupted, that is, along their width (i.e., parallel to the length of their respective gate regions $G_{N2.1}$ or $G_{N2.2}$) they do not provide a continuous diffused source or continuous diffused drain region as is implemented for NMOS transistor $N_1$ in transistor cell $TC_1$, but instead the diffused or planar width of the source or drain is separated into two different regions; in other words, assume for sake of reference that source/drain region $S/D_{N2.1a}$ is connected as a source in a given architecture, and likewise source/drain region $S/D_{N2.2a}$ is connected as a source in the given architecture; thus, the entirety of the combined widths of these two co-planar sources operate as a source for an NMOS transistor, but those two co-planar source regions are not continuous but instead separated physically from one another in the substrate (or well) into which they are formed. As a result, there is a loss of performance. Continuing with transistor cell $TC_2$, PMOS transistor $P_2$ includes a first and second P-type source/drain region $S/D_{P2a}$ and $S/D_{P2b}$ that are formed within an N-well $NW_2$, where N-well $NW_2$ is also formed in the above-mentioned semiconductor substrate or region. PMOS transistor $P_2$ also includes a gate region $G_{p2}$ formed above and between source/drain region $S/D_{P2a}$ and $S/D_{P2b}$.

Transistor cells $TC_1$ and $TC_2$ provide advantageous operation in various circuit applications. The art recognizes, however, that the choice between these cells involves tradeoffs. Specifically, transistor cell $TC_1$ is smaller and therefore consumes less area on the integrated circuit die as compared to transistor cell $TC_2$, where lower space usage is often important. Conversely, transistor cell $TC_2$ operates faster that transistor cell $TC_1$, and this faster speed is often desirable. Accordingly, this tradeoff also must be considered in circuit design and the prior art thereby provides drawbacks in its limitations of available cells with these tradeoffs. Against this background, the preferred embodiments include an additional cell layout that may be combined with the preceding cells and still others to provide further alternatives and additional performance benefits in some applications, as is appreciated from the remainder of this document.

BRIEF SUMMARY OF THE INVENTION

In one preferred embodiment there is an integrated circuit. The integrated circuit comprises an area having a layout aligned in rows. Each row is definable by a pair of row boundaries. The integrated circuit also comprises a plurality of cells, comprising a first set of cells. Each cell in the first set of cells spans at least two rows and comprises a PMOS transistor having a source/drain region that spans across one of the row boundaries and an NMOS transistor having a source/drain region that spans across one of the row boundaries.

Other aspects are also disclosed and claimed.

BRIEF DESCRIPTION OF THE SEVERAL VIEWS OF THE DRAWING

FIG. 4 illustrates a plan view of transistor cell per a preferred embodiment.

FIG. 5 illustrates a simplified layout diagram of all three cells described above, namely, transistor cells $TC_1$, $TC_2$, and $TC_3$.

DETAILED DESCRIPTION OF THE INVENTION

Figure 1:
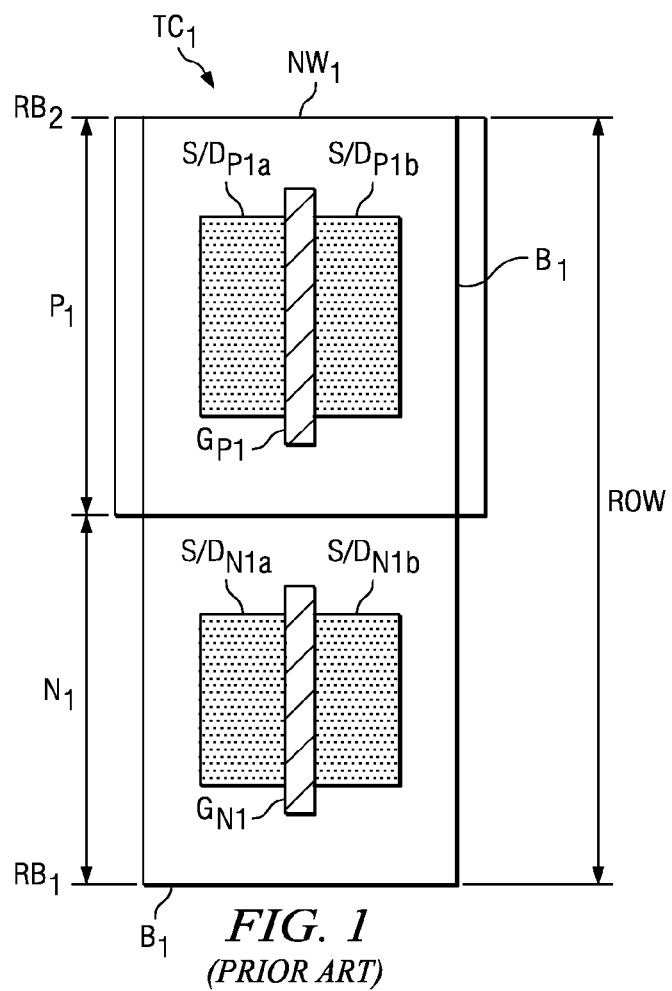
FIG. 1 illustrates a plan view of a prior art single row transistor cell.
Figure 2:
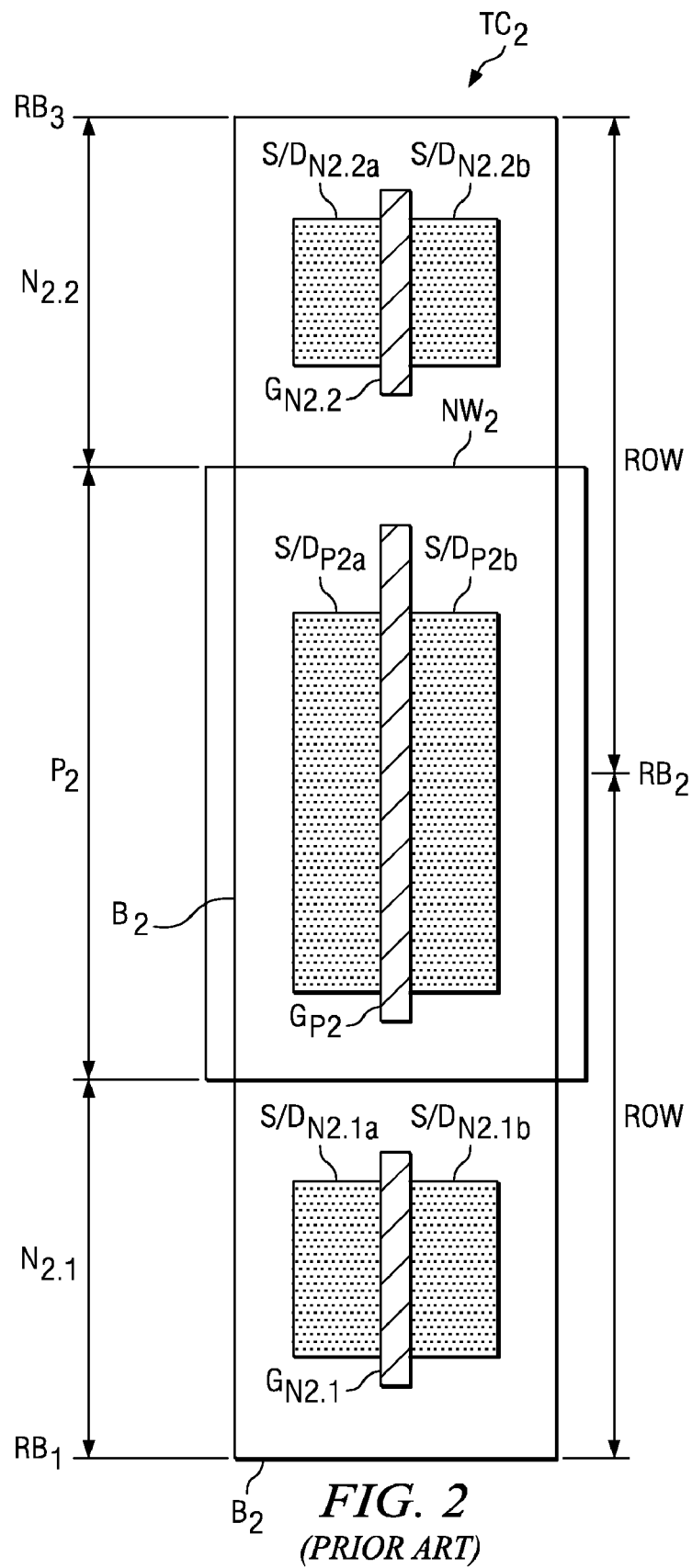
FIG. 2 illustrates a plan view of a prior art double row transistor cell.

FIGS. 1 and 2 were described above in the Background Of The Invention section of this document and the reader is assumed familiar with that discussion.

Figure 3:
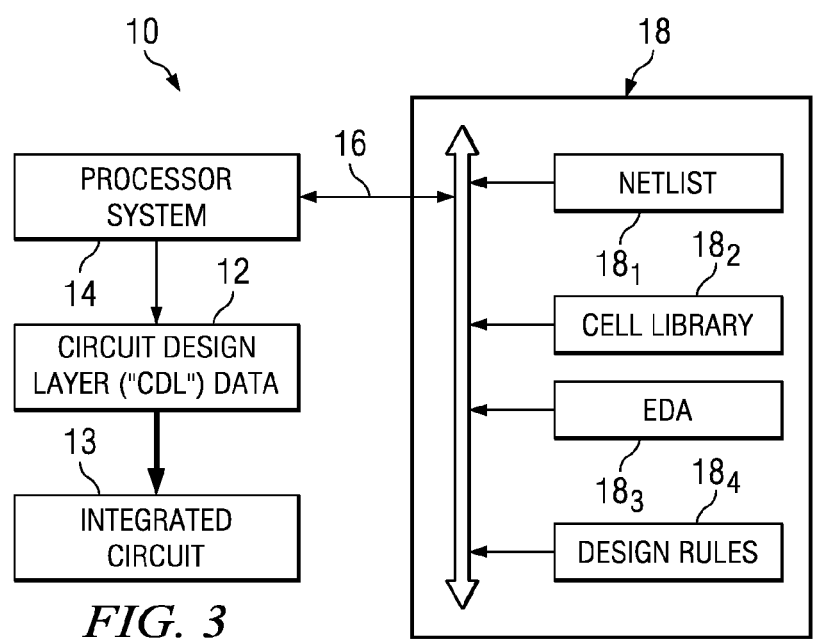
FIG. 3 illustrates a block diagram of a system for developing circuit design layer data in response to, among other things, a circuit cell library.

FIG. 3 illustrates a block diagram of a system 10 for forming circuit design layer ("CDL") data 12, where CDL data 12 presents the layout for circuit elements in an area, such as for a very large number of such elements in very large scale integration ("VLSI") or other architectures. CDL data 12 is later used to generate an integrated circuit 13, where more typically CDL data 12 is used with additional rules and data to form a reticle, multiple reticles, or the like, and that reticle is thereafter used with photolithography processes to create a corresponding integrated circuit. These latter steps are known in the art and therefore not detailed herein but rather the focus is on various inventive aspects.

Turning now to FIG. 3 in more detail, and by way of introduction, the general nature of system 10 is known in the art, but novel aspects are added thereto and improve CDL data 12, and the integrated circuit to be formed in response to that data, for reasons appreciated throughout the remainder of this document. System 10 in general includes a processor system 14 that may be embodied in various different forms of hardware and software, typically including one or more processors and/or computing devices. Processor system 14 has one or more interfaces 16 coupled to a data input store 18, where data input store 18 represents any of various forms of storage such as drives and memory, and where such storage may retain program or other data that may be read/written with respect to processor system 14. Data store 18 is shown to provide four input data files $18_1$ through $18_4$ via interface 16 to processor system 14, and each of these files is discussed below. Further, in response to these four input data files, processor system 14 provides, as an output, CDL data 12, which may be used as described above. Lastly, note that system 10 may include numerous other aspects such as are common with various computing configurations, including other input devices (e.g., keyboards, mouse, touch pad, tablet, and the like), output devices (e.g., display, monitor, and the like), as well as other media, components, devices, and peripherals, although such aspects are neither shown nor described so as to simplify the present discussion.

Input data file $18_1$ from data store 18 to processor system 14 is designated netlist $18_1$. Netlist $18_1$ represents a description of devices as defined by their nodes and the functionality of each device as between their nodes, where such devices may include any circuit element including transistors, resistors, capacitors, and so forth. Further, netlist $18_1$ includes the connections between these devices as well as their terminals, or "ports," to the external environment.

Input data file $18_2$ from data store 18 to processor system 14 is designated cell library $18_2$. As introduced earlier, a cell library, and therefore cell library $18_2$, is a collection of descriptors of the physical layouts of the component or multiple components that form a respective electrical device or devices, where each layout is referred to as a cell or standard cell. Thus, for each component, such as one more individual circuit elements, logical functions, or storage elements, one or more cells are included in cell library $18_2$ to designate a corresponding one or more physical layout of the layers used in integrated circuit construction to implement the component. Again, the inclusion of more than one cell for a given component is provided because in some instances the selection of one cell for that component is a better choice as opposed to a different cell for that same component, such as in the choice between the transistor cells $TC_1$ and $TC_2$ shown in FIGS. 1 and 2, as described earlier.

Input data file $18_3$ from data store 18 to processor system 14 is an Electronic Design Automation ("EDA") computer program $18_3$, which typically when executed by a processor performs various operations with respect to data such as data files $18_1$ and $18_2$. Specifically, the EDA operations typically include so-called placement and routing and therefore program $18_3$ is sometimes referred to as a P&R program or tool. Placement in the EDA context refers to the assignment of a location for each component in netlist $18_1$, as guided by certain rules that accompany the placement determination. In other words, EDA program $18_3$, when executed by processing system 14, defines a two-dimensional area that corresponds to the area of integrated circuit 13 to be constructed, and the placement operation of EDA computer program $18_2$ then determines the location within that area for each component in netlist $18_1$ so that the determined placement is according to, and does not violate, the accompanying placement rules. FIGS. 1 and 2, introduced earlier, depict examples of the placement of cells $TC_1$ and $TC_2$, respectively, where such placement is typically by alignment of the a boundary border in at least one dimension such as along rows that by way of example in FIGS. 1 and 2 are shown between either row boundary lines $RB_1$ and $RB_2$ or row boundary lines $RB_1$ and $RB_3$. After placement, routing in the EDA context refers to the determination of where interconnects are to be located in each cell and between such cells. The interconnects are conductors of both signals between devices as well as power supply lines (high and low, including ground). As also demonstrated later, and in connection with routing, each cell has a number of so-called tracks associated with it, where each track represents a different parallel imaginary line, parallel to the row, and crossing the cell at a different height dimension. Given the tracks, they provide location indications or guides along which an interconnect may be placed. For example, transistor cell $TC_1$ of FIG. 1 is sometimes referred to as an 8-track cell in that it has 8 such imaginary lines (not shown) extending parallel to and in between row boundary lines $RB_1$ and $RB_2$. Similarly transistor cell $TC_2$ of FIG. 2 is sometimes referred to as a 16-track cell in that it has 16 such imaginary lines (not shown) extending parallel to and in between row boundary lines $RB_1$ and $RB_3$. Because each track across a cell represents a passageway at a different height, then if an interconnect extends along one such track it will not physically contact or interfere with a different interconnect along a different track across the same cell. The interconnects also include conductor portions that may extend from a track toward components in the cell, where such conductors are sometimes referred to as vias or plugs. Further, in the prior art often the power supply lines (e.g., $V_{DD}$, $V_{ss}$) are dedicated to the same tracks across a large number of cells so that the power lines may be efficiently routed to provide power to the components in each such cell. Lastly, note that EDA is sometimes assumed to include the operation of synthesis so as to create netlist $18_1$, such as from a register transfer level ("RTL") description, but for sake of simplifying the present discussion netlist $18_1$ is simply shown in FIG. 3 as a separate data input file to processor system 14.

Input data file $18_4$ from data store 18 to processor system 14 is design rules file $18_4$, which verifies or constrains the routing and placing of EDA computer program $18_3$. Specifically, the design rules of file $18_4$ are checked to ensure that there are no violations of certain parameters, typically specified by the manufacturer, sometimes referred to as the "foundry," that will build integrated circuit 13. For example, such rules may pertain to transistor feature spacing, metal layer thickness, and power density rules.

The operation of system 10 is well known in the art and also should be understood with reference to the descriptions above of the various input files, where system 10 is further improved in the preferred embodiments by the addition of a novel cell into library $18_2$, thereby improving the overall system 10, its output CDL data 12, and any integrated circuit 13 manufactured from such data. Briefly discussing such operation, processor system 14 inputs netlist $18_1$ and per EDA file $18_3$ selects the appropriate cells from cell library $18_2$ and places and routes them in a two dimensional space. Further, the placement and routing is per design rules $18_4$, where any violations of such rules are flagged and or corrected. Once the violations are corrected or accepted, the result from processor system 14 is in the form of CDL data 12. Further in this regard, therefore, CDL data 12 thus provides a digitization of multiple desired circuit layers, thereby illustrating respective desired corresponding images to be formed on respective reticles so that each circuit layer may be formed later on a wafer and with features in the same shape and with scaled dimensions of the image, and that wafer is separated into pieces where many or all of those pieces each provides integrated circuit 13. Accordingly, CDL data 12 may indicate locations, layout, shape, and dimensions of features to be formed on a wafer and ultimately in integrated circuit 13. One skilled in the art will appreciate numerous other examples of types of structures and layers that may be indicated in CDL data 12.

FIG. 4 illustrates a plan view of transistor cell $TC_3$ per a preferred embodiment and for inclusion, by way of example, into cell library $18_2$ so as to improve CDL data 12 and integrated circuit 13 that is ultimately is constructed from that data. By way of introduction, transistor cell $TC_3$ has a border $B_3$ that is again aligned along row boundaries but that spans three rows. Particularly, in this preferred embodiment, and as detailed later, transistor cell $TC_3$ is positioned and aligned so that it spans across three cell rows, occurring between row boundary lines $RB_1$ and $RB_4$. More particularly and in one embodiment, transistor cell $TC_3$ includes a first spare area $SA_1$ in part of the area between row boundary lines $RB_1$ and $RB_2$, a second spare area $SA_2$ in part of the area between row boundary lines $RB_3$ and $RB_4$, an NMOS transistor $N_3$ and PMOS transistor $P_3$. Each spare area $SA_x$ is referred to as "spare" in the sense that it does not include any of the components needed to implement either of the cell's transistors, but those same spare areas $SA_x$ may instead be occupied by other components in addition to the transistors that are in transistor cell $TC_3$. With respect to the transistors of transistor cell $TC_3$, they are described immediately below.

Looking now to NMOS transistor $N_3$ and PMOS transistor $P_3$, in the embodiment in FIG. 4, these two transistors along with spare areas $SA_1$ and $SA_2$ form a cell that may be referred to as a triple row cell because the boundary $B_3$ around those devices extends along three rows as between row boundary lines $RB_1$ and $RB_4$. As with the prior art, boundary line $B_3$ is an imaginary border, here with respect to cell $TC_3$, and is used for aligning the cell relative to other cells (not shown) in a physical circuit layout. NMOS transistor $N_3$ includes a first and second N-type source/drain region $S/D_{N3a}$ and $S/D_{N3b}$ that are formed within a semiconductor substrate or region that is not perceptible from the perspective of FIG. 4. NMOS transistor $N_3$ also includes a gate region $G_{N3}$ formed above and between source/drain regions $S/D_{N3a}$ and $S/D_{N3b}$ (although the source/drain regions may, in some approaches, extend to some extent under the gate region). PMOS transistor $P_3$ includes a first and second P-type source/drain region $S/D_{P3a}$ and $S/D_{P3b}$, each of which is formed within an N-type well $NW_3$ (or N-well), where N-well $NW_3$ is also formed in the above-mentioned semiconductor substrate or region that is not perceptible from the perspective of FIG. 4. PMOS transistor $P_3$ also includes a gate region $G_{P3}$ formed above and between source/drain regions $S/D_{P3a}$ and $S/D_{P3b}$ (although the source/drain regions may, in some approaches, extend to some extent under the gate region).

Attention is now directed to the a real differences as between the transistor cell $TC_3$, as compared to transistor cells $TC_1$ and $TC_2$ of the prior art. As introduced above, in one embodiment transistor cell $TC_3$ spans three rows, whereas transistor cell $TC_1$ spans only a single row and transistor $TC_2$ spans two rows. This difference in a preferred embodiment is now explored in greater detail, starting first with reference to FIG. 5. FIG. 5 illustrates a simplified layout diagram of all three cells described above, namely, transistor cells $TC_1$, $TC_2$, and $TC_3$. To simplify the FIG. 5 illustration, each cell $TC_x$ is shown by its respective boundary $B_1$, $B_2$, and $B_3$. With this illustration, one skilled in the art may easily appreciate the difference in area occupied by each cell. From FIG. 5, therefore, note that transistor cell $TC_3$ consumes more area than either transistor cell $TC_1$ or transistor cell $TC_2$. However, recall that the area of transistor cell $TC_3$ includes spare areas $SA_1$ and $SA_2$. Therefore, various different versions of the cell may be further specified to include additional items in the area. For example, within each spare area there may be provided transistors smaller than NMOS transistor $N_3$ and PMOS transistor $P_3$ (e.g., for use in a flip-flop or multiplexer), decoupling capacitors or transistors, diffusion antenna protection devices, and failure analysis targets.

In addition to the preceding, and returning now to FIG. 4, transistor cells $TC_3$ may be appreciated to provide various benefits over the prior art, and these benefits in various instances may render the selection of transistor cells $TC_3$ favorable over the prior art transistor cells $TC_1$ and $TC_2$. Specifically, in a comparison of transistor cell $TC_3$ to transistor cell $TC_1$, the width of each source or drain region (shown in the vertical dimension and parallel to the respective gate) is greater for transistor cell $TC_3$. As a result, the switching delay for transistor cell $TC_3$ is lower than that of transistor cell $TC_1$, that is, transistor cell $TC_3$ provides better speed performance. In a comparison of transistor cell $TC_3$ to transistor cell $TC_2$, note that transistor cell $TC_2$ has various limitations that do not exist in transistor cell $TC_3$. For example, transistor cell $TC_2$ has an efficiency loss in that its half transistors in effect provide two physically separated or non-continuous source regions and two physically separated or non-continuous drain regions; these regions require interconnects to connect the respective source and drain regions of NMOS half transistor $N_{2.1}$ and NMOS half transistor $N_{2.2}$. Further, layout rule checks require certain minimum space requirements, such as between N-well $NW_2$ of PMOS transistor $P_2$ and both the source/drain regions $S/D_{N2.1a}$ and $S/D_{N2.1b}$ of NMOS half transistor $N_{2.1}$ and the source/drain regions $S/D_{N2.2a}$ and $S/D_{N2.2b}$ of NMOS half transistor $N_{2.2}$, and also as between gate conductor $GP_2$ and both gate conductors $GN_{2.1}$ and $GN_{2.2}$; as a result, a certain amount of transistor width is lost for NMOS transistor $N_1$. Thus, there is a loss of transistor width in transistor cell $TC_2$, and there is greater transistor level intraparasitic effect, as compared to transistors $P_3$ and $N_3$ of transistor cell $TC_3$. Particularly, transistor cell $TC_3$ includes a single PMOS transistor $P_3$ and a single NMOS transistor $N_3$, without having to divide (e.g., halve) either such transistor into portions, so both of these latter transistors benefit. Further, in transistor cell $TC_3$, there is therefore less unused transistor area in one cell. In addition, note that by having transistor cell $TC_3$ span three rows in one embodiment, it is compatible with contemporary placement and routing tools and therefore may be readily included in cell library $18_2$ and processed per EDA program $18_3$ without any changes to the latter. Thus, using system 10, transistor cell $TC_3$ may be mixed with other transistor cells (e.g., $TC_1$ and $TC_2$) in a given layout for integrated circuit 13.

Figure 6B:
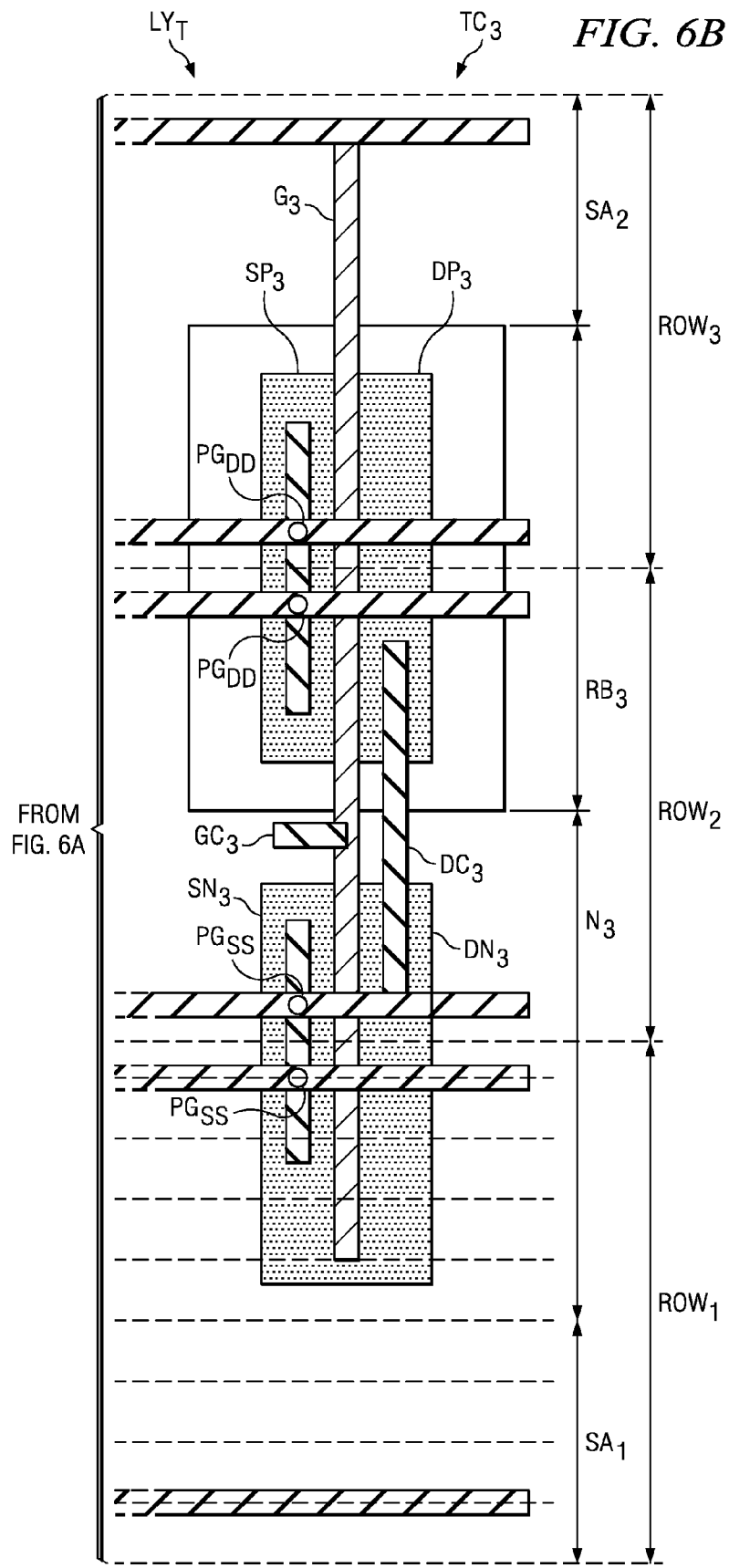
FIG. 6 illustrates a layout LYT that includes all of the three transistor cells $TC_1$, $TC_2$, and $TC_3$ and with power conductors spanning across all those cells in a same dimension.

For sake of further appreciating the inventiveness of the preferred embodiments, FIG. 6 illustrates a layout LYT that includes all of the three transistor cells $TC_1$, $TC_2$, and $TC_3$ described earlier in this document, with an example of various interconnects and to appreciate how such cells may be presented in CDL data 12 and likewise formed on integrated circuit 13. Further, certain reference numbers from earlier FIGS. are carried forward into FIG. 6 while others are changed to simplify the illustration and the discussion of additional connections illustrated therein. Additionally, and as discussed earlier, system 10 aligns cells in an area along rows, and in this regard in FIG. 6 three such rows are shown, namely, a $ROW_1$ between row boundary lines $RB_1$ and $RB_2$, a $ROW_2$ between row boundary lines $RB_2$ and $RB_3$, and a $ROW_3$ between row boundary lines $RB_3$ and $RB_4$. As discussed earlier, each cell, and hence each $ROW_x$ in FIG. 6, has a number of tracks associated with it, where in FIG. 6 such tracks are shown only in $ROW_1$ so as not to overburden the Fig., and are designated $TRK_1$ through $TRK_8$; each track $TRK_x$ represents a different imaginary line parallel to the row boundary and crossing the cell/row at a different height dimension, and along which an interconnect may be placed. Thus, since transistor cell $TC_1$ spans only one row (e.g., $ROW_1$), then it is considered an 8-track cell; however, since the larger transistor components of transistor cell $TC_2$ spans two rows, then that cell may be considered a 16-track cell. Also in this regard, in layout LYT power conductors are shown along certain tracks, where recall that system 10 determines the location and route of such conductors as part of the routing operation from EDA computer program $18_2$. Thus, in $ROW_1$, a $V_{SS}$ power conductor is shown along track $TRK_1$, and a $V_{DD}$ power conductor is shown along track $TRK_8$. Similarly in $ROW_2$ and $ROW_3$, one skilled in the art will appreciated that there is a $V_{SS}$ and $V_{DD}$ power conductor at the tracks nearest the row line boundaries for each such row, where in $ROW_2$ the $V_{SS}$ power conductor is at the bottom track (i.e., nearest boundary line $RB_2$) and the $V_{DD}$ power conductor is at the top track (i.e., nearest boundary line $RB_3$), where in opposite fashion in $ROW_3$ the $V_{SS}$ power conductor is at the top track (i.e., nearest boundary line $RB_4$) and the $V_{DD}$ power conductor is at the bottom track (i.e., nearest boundary line $RB_3$).

Continuing with layout LYT, each transistor cell $TC_x$ includes additional interconnects so that the transistors in each cell form a respective inverter, which as well known in the art comprises a p-channel transistor having it source connected to $V_{DD}$, an n-channel transistor having its source connected to $V_{SS}$, the gates of the two transistors connected to one other and acting as an input, and the drains of the two transistors connected to one other and acting as an output.

Looking at the connections forming an inverter in transistor cell $TC_1$, a single gate $G_1$ is shown connecting the gate regions of PMOS transistor $P_1$ and NMOS transistor $N_1$, and gate $G_1$ is further connected to an overlying gate conductor $GC_1$. Further, a drain conductor $DC_1$ connects the respective drains $DP_1$ and $DN_1$ of PMOS transistor $P_1$ and NMOS transistor $N_1$. Lastly, the source $SP_1$ of PMOS transistor $P_1$ is connected by a plug $PG_{DD}$ to the $V_{DD}$ conductor along the top track of $ROW_2$, and the source $SN_1$ of NMOS transistor $N_1$ is connected by a plug $PG_{SS}$ to the $V_{SS}$ conductor along the bottom track of $ROW_2$.

Looking at the connections forming an inverter in transistor cell $TC_2$, a single gate $G_2$ is shown connecting the gate regions of PMOS transistor $P_1$ and NMOS half transistors $N_{2.1}$ and $N_{2.2}$, and gate $G_2$ is further connected to an overlying gate conductor $GC_2$. Further, a drain conductor $DC_2$ connects the drain $DP_2$ of PMOS transistor $P_2$ with the drain $DN_{2.1}$ of NMOS half transistor $N_{2.1}$ and with the drain $DN_{2.2}$ of NMOS half transistor $N_{2.2}$. The source $SP_2$ of PMOS transistor $P_2$ is connected by respective plugs $PG_{DD}$ to the $V_{DD}$ conductor along the top track of $ROW_2$ and to the $V_{DD}$ conductor along the bottom track of $ROW_3$. Lastly, the source $SN_{2.1}$ of NMOS half transistor $N_{2.1}$ is connected by a plug $PG_{SS}$ to the $V_{SS}$ conductor along the bottom track of $ROW_2$, and the source $SN_{2.2}$ of NMOS half transistor $N_{2.2}$ is connected by a plug $PG_{SS}$ to the $V_{SS}$ conductor along the top track of $ROW_3$.

Looking at the connections forming an inverter in transistor cell $TC_3$, a single gate $G_3$ is shown connecting the gate regions of PMOS transistor $P_3$ and NMOS transistor $N_3$, and gate $G_3$ is further connected to an overlying gate conductor $GC_3$. Further, a drain conductor $DC_3$ connects the drain $DP_3$ of PMOS transistor $P_3$ with the drain $DN_3$ of NMOS transistor $N_3$. The source $SP_3$ of PMOS transistor $P_3$ is connected by respective plugs $PG_{DD}$ to the $V_{DD}$ conductor along the bottom track of $ROW_3$ and to the $V_{DD}$ conductor along the top track of $ROW_2$. Lastly, the source $SN_3$ of NMOS transistor $N_3$ is connected by respective plugs $PG_{SS}$ to the $V_{SS}$ conductor along the bottom track of $ROW_2$ and to the $V_{SS}$ conductor along the top track of $ROW_1$.

Given layout LYT, one skilled in the art may further appreciate the above-noted differences between the inventive transistor cell $TC_3$ and transistor cells $TC_1$ and $TC_2$. Moreover, layout LYT also depicts the benefits of transistor cell $TC_3$ as mentioned above, including the availability of spare areas $SA_1$ and $SA_2$ for use with other devices and the ability to align transistor cell $TC_3$ along three rows, thereby rendering it compatible with contemporary placement and routing tools. In addition, layout LYT demonstrates that transistor cell $TC_3$ has an orientation whereby the source/drain region of both its PMOS transistor and its NMOS transistor spans across a respective row boundary and, as a result, it accommodates the power conductors and metal pitch of other standard cells, where for example in FIG. 6 it may be seen that power conductors $V_{SS}$ and $V_{DD}$ pass along the same track for each different cell. Note therefore, that transistor cell $TC_3$ may be combined with other standard cells, such as cells $TC_1$ and $TC_2$ within a so-call soft region or block of an area on an integrated circuit. Accordingly, very high performance circuit can be formed from transistor cells of the type of transistor cell $TC_3$ while lower performance requiring areas (e.g., control logic) may be constructed using 8-track cells such as transistor cell $TC_1$. Still other observations and benefits will be appreciable by one skilled in the art.

Figure 7:
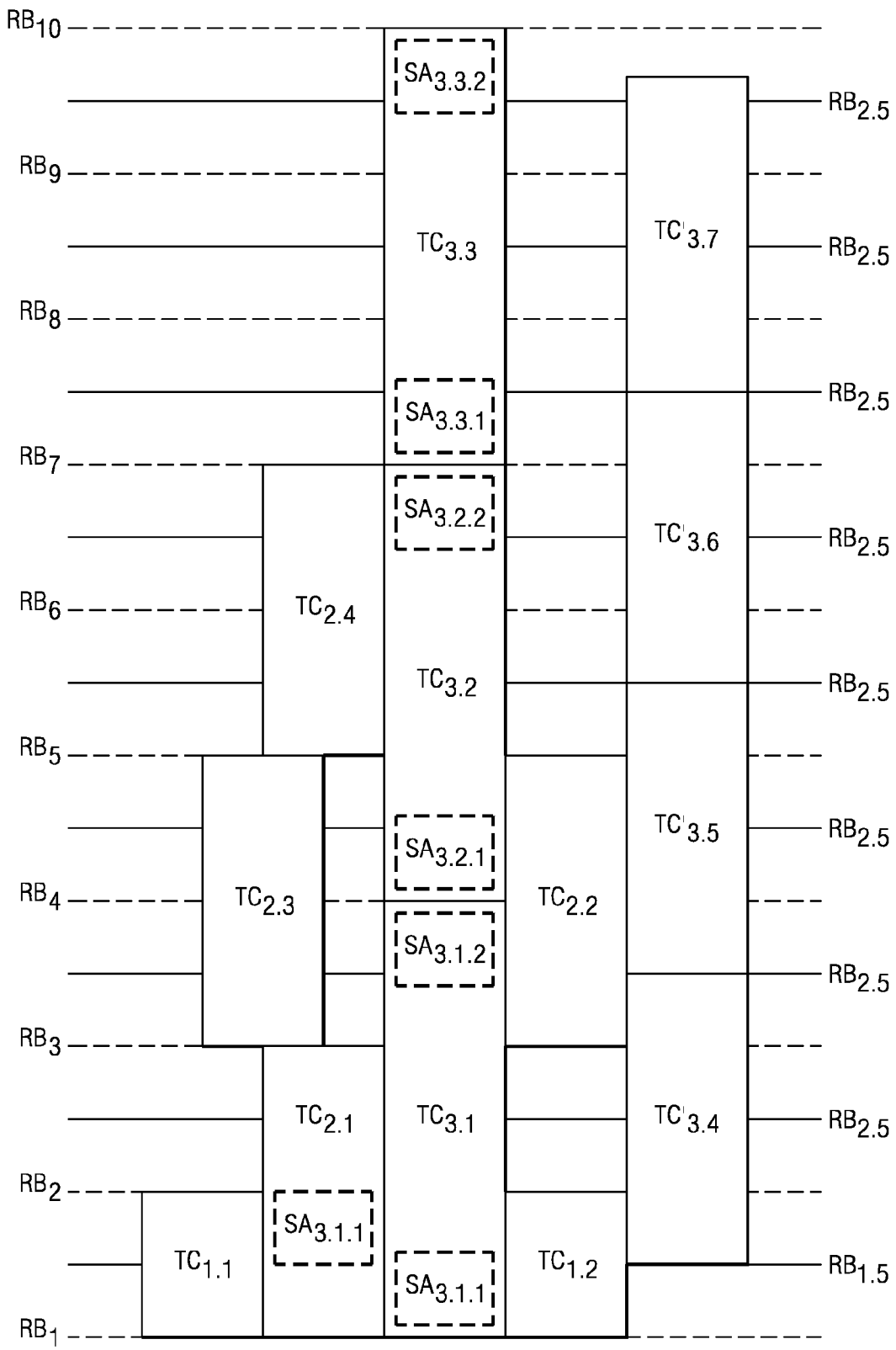
FIG. 7 illustrates another layout diagram of the three cells $TC_1$, $TC_2$, and $TC_3$ as well as a modified cell $TC^*_3$ as an alternative embodiment.

FIG. 7 illustrates another layout diagram of all three cells described above, namely, transistor cells $TC_1$, $TC_2$, and $TC_3$. For sake of convention, each transistor cell of the type of transistor cell $TC_1$ includes an identifier $TC_{1.x}$, where the different number of x depicts different instances of a single row transistor cell of the type in FIG. 1. Similarly, each transistor cell of the type of transistor cell $TC_2$ includes an identifier $TC_{2.x}$, where the different number of x depicts different instances of a double row transistor cell of the type in FIG. 2. Still further, each transistor cell of the type of transistor cell $TC_3$ includes an identifier $TC_{3.x}$, where the different number of x depicts different instances of a triple row transistor cell of the type in FIG. 4; indeed, for each such instance, note further that each cell $TC_{3.x}$ includes a spare area $SA_{3.x.2}$ at its top and a spare area $SA_{3.x.1}$ at its bottom, as described earlier in connection with FIG. 4. Moreover, as to these cells $TC_{3.x}$, each occupies three rows as described earlier. For example, transistor cell $TC_{3.1}$, is located in the row between row boundary lines $RB_1$ and $RB_4$. As another example, transistor cell $TC_{3.2}$, is located in the row between row boundary lines $RB_4$ and $RB_7$.

In addition to the preceding, FIG. 7 depicts an alternative embodiment for transistor cell $TC_3$, where each instance of such an embodiment includes a superscript asterisk in the reference identifier—thus, four such instances are shown, as $TC^*_{3.4}$, $TC^*_{3.5}$, $TC_{3.6}$, and $TC^*_{3.7}$. For each such alternative embodiment, the spare areas from FIG. 4 are eliminated so that the alternative cell occupies only two rows instead of three rows as detailed above; however, from FIG. 6 one skilled in the art will now appreciate that if the spare areas of a transistor cell $TC_3$ are removed, then alignment of the modified cell requires that each boundary end of the cell be aligned along the middle of a row. To illustrate this aspect, FIG. 7 also illustrates the midpoint of each row. By way of examples of this illustration, a row boundary line midpoint $RB_{1.5}$ is shown midway between row boundary lines $BR_1$ and $RB_2$, a row boundary line midpoint $RB_{2.5}$ is shown midway between row boundary lines $BR_2$ and $RB_3$, and so forth for the remaining row boundary lines in FIG. 7. Given these conventions, then note with respect to modified transistor cell $TC^*_{3.4}$, it has no spare areas and spans only two rows, where the boundary bottom of that resulting two cell row is aligned with row boundary line midpoint $RB_{1.5}$ and the boundary top of that resulting two cell row is aligned with row boundary line midpoint $RB_{2.5}$. Similarly, for modified transistor cell $TC_{3.5}$, it also has no spare areas and spans only two rows, where the boundary bottom of that resulting two cell row is aligned with row boundary line midpoint $RB_{2.5}$ and the boundary top of that resulting two cell row is aligned with row boundary line midpoint $RB_{3.5}$. Thus, FIG. 7 illustrates that if a placement and routing tool is modified so as to be operable to locate cells on row midpoints, then the preferred embodiment may be modified so as to eliminate its spare areas and occupy only two rows, albeit aligned between row midpoints. In this instance, such modified cells may be aligned in adjacent rows (i.e., in the vertical dimension in FIG. 7) so that each instance of this alternative preferred embodiment occupies no more area than transistor cell $TC_2$ of the prior art and with no gaps in that same dimension between adjacent cells. In this manner, therefore, the additional performance benefits of transistor cell $TC_3$ are realized without any area penalty as compared to transistor cell $TC_2$.

From the above, it may be appreciated that the preferred embodiments provide inventive cell technology, where such technology may be implemented in data cell libraries and constructed on integrated circuits. Various benefits have been discussed above, and one skilled in the art will further appreciate that the preferred embodiments are readily scalable for use in VLSI applications, thereby improving the entirety of the application. Further, various alternatives have been provided according to preferred embodiments, and still others may be ascertained by one skilled in the art. Given the preceding, therefore, one skilled in the art should further appreciate that while the present embodiments have been described in detail, various substitutions, modifications or alterations could be made to the descriptions set forth above without departing from the inventive scope, as is defined by the following claims.

The invention claimed is:

1. An integrated circuit, comprising:
   an area having a layout aligned in rows, wherein each row is definable by a pair of row boundaries;
   a plurality of cells, comprising a first set of cells, wherein each cell in the first set of cells spans at least two rows and comprises:
   a PMOS transistor having a first source/drain region and a second source/drain region that both span across a first one of the row boundaries; and
   an NMOS transistor having a first source/drain region and a second source/drain region that both span across a second one of the row boundaries.

2. The integrated circuit of claim 1 wherein each cell in the first set of cells spans at least three rows.

3. The integrated circuit of claim 1 wherein each cell in the first set of cells spans comprises:
   a first area extending from a first row boundary toward the source/drain region of the PMOS transistor;
   a second area extending from a second row boundary toward the source/drain region of the NMOS transistor; and
   circuitry located in the first and second area.

4. The integrated circuit of claim 3 wherein the circuitry located in the first and second area is selected from a set consisting of an additional transistor that is smaller than the NMOS transistor and the PMOS transistor, a decoupling capacitor, a diffusion antenna protection device, and a failure analysis target.

5. The integrated circuit of claim 1 wherein the plurality of cells further comprises a second set of cells, wherein each cell in the second set of cells spans one row.

6. The integrated circuit of claim 1 wherein the plurality of cells further comprises a second set of cells, wherein each cell in the second set of cells spans two rows.

7. The integrated circuit of claim 6 wherein each cell in the second set of cells comprises:
   a first transistor of a first conductivity type; and
   a second transistor of a second conductivity type, wherein a source/drain region of one of the first and second transistor comprises two physically separated regions.

8. The integrated circuit of claim 6 wherein each cell in the first set of cells spans at least three rows.

9. The integrated circuit of claim 1:
   wherein the plurality of cells further comprises a second set of cells, wherein each cell in the second set of cells spans one row; and
   wherein the plurality of cells further comprises a third set of cells, wherein each cell in the third set of cells spans two rows.

10. The integrated circuit of claim 9 and further comprising a power conductor spanning in a single dimension, parallel to a row in the rows, across a cell in the first set, a cell in the second set, and a cell in the third set.

11. The integrated circuit of claim 1 wherein the first source/drain region of the PMOS transistor is oriented relative to the first source/drain region of the NMOS transistor such that an imaginary line perpendicular to the first and second ones of the row boundaries passes through the first source/drain region of the PMOS transistor and the first source/drain region of the NMOS transistor.

* * * * *